(12) United States Patent
Kim

(10) Patent No.: US 12,408,280 B2
(45) Date of Patent: Sep. 2, 2025

(54) CIRCUIT BOARD AND DISPLAY DEVICE INCLUDING THE SAME

(71) Applicant: Samsung Display Co., Ltd., Yongin-si (KR)

(72) Inventor: Jooyoung Kim, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 180 days.

(21) Appl. No.: 18/094,667

(22) Filed: Jan. 9, 2023

(65) Prior Publication Data

US 2023/0300993 A1 Sep. 21, 2023

(30) Foreign Application Priority Data

Mar. 15, 2022 (KR) .................. 10-2022-0032089

(51) Int. Cl.
*H05K 5/00* (2025.01)
*H05K 1/16* (2006.01)
(Continued)

(52) U.S. Cl.
CPC ............. *H05K 5/0018* (2022.08); *H05K 1/16* (2013.01); *H05K 3/0011* (2013.01); *H05K 3/301* (2013.01);
(Continued)

(58) Field of Classification Search
CPC ...... H05K 1/02; H05K 1/0225; H05K 1/0231; H05K 1/0242; H05K 1/025; H05K 1/0253; H05K 1/0274; H05K 1/0296; H05K 1/16; H05K 1/114; H05K 1/115; H05K 1/145; H05K 1/162; H05K 1/183; H05K 1/185; H05K 3/0011; H05K 3/0023; H05K 3/46; H05K 3/301; H05K 3/321; H05K 3/3457; H05K 3/4617; H05K 3/4697; H05K 5/0008; H05K 5/0069; H01L 21/56; H01L 21/481; H01L 21/4853; H01L 21/4857; H01L 23/13; H01L 23/15; H01L 23/34; H01L 23/36; H01L 23/50; H01L 23/66; H01L 23/259; H01L 23/3134; H01L 23/4617;
(Continued)

(56) References Cited

U.S. PATENT DOCUMENTS 4,903,318 A * 2/1990 Nagata .................. H01H 9/063
200/1 V
6,534,723 B1 * 3/2003 Asai .................. H01L 23/49811
174/262
(Continued)

FOREIGN PATENT DOCUMENTS

| KR | 101182442 B1 | 9/2012 |
|---|---|---|
| KR | 1020180063413 A | 6/2018 |
| KR | 102304700 B1 | 9/2021 |

*Primary Examiner* — Andargie M Aychillhum
(74) *Attorney, Agent, or Firm* — CANTOR COLBURN LLP

(57) ABSTRACT

A circuit board includes a board including a first surface and a second surface opposing the first surface, where the board includes at least one conductive layer and at least insulating layer, a plurality of electronic elements disposed on the first surface of the board, and a plurality of resistive pads disposed on the second surface of the board and electrically connected to at least one selected from the electronic elements. The resistive pads have a resistance of zero ohm.

13 Claims, 10 Drawing Sheets

(51) Int. Cl.
  *H05K 3/00* (2006.01)
  *H05K 3/30* (2006.01)
  *H05K 3/32* (2006.01)
  *H05K 3/34* (2006.01)
(52) U.S. Cl.
  CPC ........... *H05K 3/321* (2013.01); *H05K 3/3457* (2013.01); *H05K 5/0069* (2013.01)
(58) Field of Classification Search
  CPC ............. H01L 23/4682; H01L 23/4688; H01L 23/4697; H01L 23/5283; H01L 23/5386; H01L 23/49517; H01L 23/49568; H01L 23/49811; H01L 23/49816; H01L 23/49822; H01L 23/49827; H01L 23/49833; H01L 23/49838; H01L 24/09; H01L 24/71; H01L 24/20; H01L 24/35; H01L 24/49; H01L 24/85; H01L 25/00; H01L 25/0652; H01L 25/16; H01L 25/105; G09G 3/3225; G09G 3/3233; G09G 3/3266; G09G 3/3275
  USPC ............ 361/748, 306.3, 311, 763, 782, 792; 174/255, 258, 260, 261, 264; 257/532, 257/690, 700, 778; 29/829, 837, 846
  See application file for complete search history.

(56) References Cited

U.S. PATENT DOCUMENTS

| | | | | |
|---|---|---|---|---|
| 6,724,638 B1* | 4/2004 | Inagaki | .................. | H05K 1/186 |
| | | | | 257/E23.079 |
| 6,952,049 B1* | 10/2005 | Ogawa | .................. | H01L 23/642 |
| | | | | 257/700 |
| 7,678,612 B2* | 3/2010 | Fujii | .................. | H01L 23/552 |
| | | | | 438/118 |
| 8,331,101 B2* | 12/2012 | Aoki | .................. | H05K 1/145 |
| | | | | 361/763 |
| 8,471,275 B2 | 6/2013 | Lee et al. | | |
| 10,477,676 B2 | 11/2019 | Kim | | |
| 2003/0116843 A1* | 6/2003 | Iijima | .................. | H01L 24/05 |
| | | | | 257/700 |
| 2004/0184219 A1* | 9/2004 | Otsuka | .............. | H01L 23/49805 |
| | | | | 257/E23.079 |
| 2007/0030628 A1* | 2/2007 | Yamamoto | ............. | H01G 4/232 |
| | | | | 361/311 |
| 2007/0223935 A1* | 9/2007 | Asai | .................. | G02B 6/43 |
| | | | | 398/164 |
| 2008/0169120 A1* | 7/2008 | Inagaki | .................. | H05K 1/187 |
| | | | | 257/E23.079 |
| 2009/0139760 A1* | 6/2009 | Tanaka | .................. | H05K 1/162 |
| | | | | 29/829 |
| 2009/0321118 A1* | 12/2009 | Kim | .................. | H01L 23/5389 |
| | | | | 174/260 |
| 2010/0308451 A1* | 12/2010 | Kodani | .................. | H05K 1/09 |
| | | | | 257/E23.068 |
| 2010/0314254 A1* | 12/2010 | Kodani | ............. | H01L 23/49822 |
| | | | | 205/78 |
| 2011/0024167 A1* | 2/2011 | Hashimoto | .......... | H05K 3/4688 |
| | | | | 29/846 |
| 2011/0304016 A1* | 12/2011 | Nakamura | ............. | H05K 3/284 |
| | | | | 257/532 |
| 2011/0310229 A1* | 12/2011 | Ueda | .................... | G01B 11/306 |
| | | | | 348/46 |
| 2012/0014641 A1* | 1/2012 | Maetani | .................... | G02B 6/43 |
| | | | | 385/14 |
| 2012/0206682 A1* | 8/2012 | Onishi | ............. | G02F 1/136204 |
| | | | | 349/138 |
| 2012/0234589 A1* | 9/2012 | Furuichi | ........... | H01L 23/49822 |
| | | | | 29/837 |
| 2014/0085851 A1* | 3/2014 | Arnold | .................... | H05K 1/141 |
| | | | | 361/782 |
| 2016/0004122 A1* | 1/2016 | Ono | .................... | G06F 3/0412 |
| | | | | 349/96 |
| 2016/0353576 A1* | 12/2016 | Kusama | ............. | H01L 23/3142 |
| 2017/0033038 A1* | 2/2017 | Nakagawa | ............. | H01L 25/00 |
| 2017/0221848 A1* | 8/2017 | Iguchi | .................... | H01L 23/528 |
| 2018/0145054 A1* | 5/2018 | Kim | ........................ | H01L 23/66 |
| 2018/0210634 A1 | 7/2018 | Kim et al. | | |
| 2018/0277473 A1* | 9/2018 | Nakagawa | ............. | H01L 25/00 |
| 2018/0374788 A1* | 12/2018 | Nakagawa | ............. | H01L 25/18 |
| 2019/0131722 A1* | 5/2019 | Ryu | ........................ | H01Q 25/005 |
| 2019/0326367 A1* | 10/2019 | Jung | ........................ | G06V 40/13 |
| 2019/0363157 A1* | 11/2019 | Karashima | ............. | H01L 24/17 |
| 2020/0091273 A1* | 3/2020 | Lee | ........................ | H10K 59/10 |
| 2020/0135821 A1* | 4/2020 | Seo | ........................ | H05K 1/144 |
| 2020/0152566 A1* | 5/2020 | Oh | ........................ | H05K 1/183 |
| 2021/0056908 A1* | 2/2021 | Park | ........................ | G09G 3/3275 |
| 2021/0134754 A1* | 5/2021 | Tsukada | ............. | H01L 23/36 |
| 2021/0168937 A1* | 6/2021 | Guo | ........................ | G02B 6/0083 |
| 2021/0272515 A1* | 9/2021 | Choi | ........................ | G09G 3/3233 |
| 2021/0319727 A1* | 10/2021 | Kim | ........................ | H01L 33/502 |
| 2021/0359081 A1* | 11/2021 | Kong | ........................ | H10K 59/18 |
| 2022/0061147 A1* | 2/2022 | Kim | ........................ | H05K 1/025 |
| 2022/0304147 A1* | 9/2022 | Kim | ........................ | H05K 1/0296 |
| 2022/0335899 A1* | 10/2022 | Park | ........................ | G09G 3/3266 |

* cited by examiner

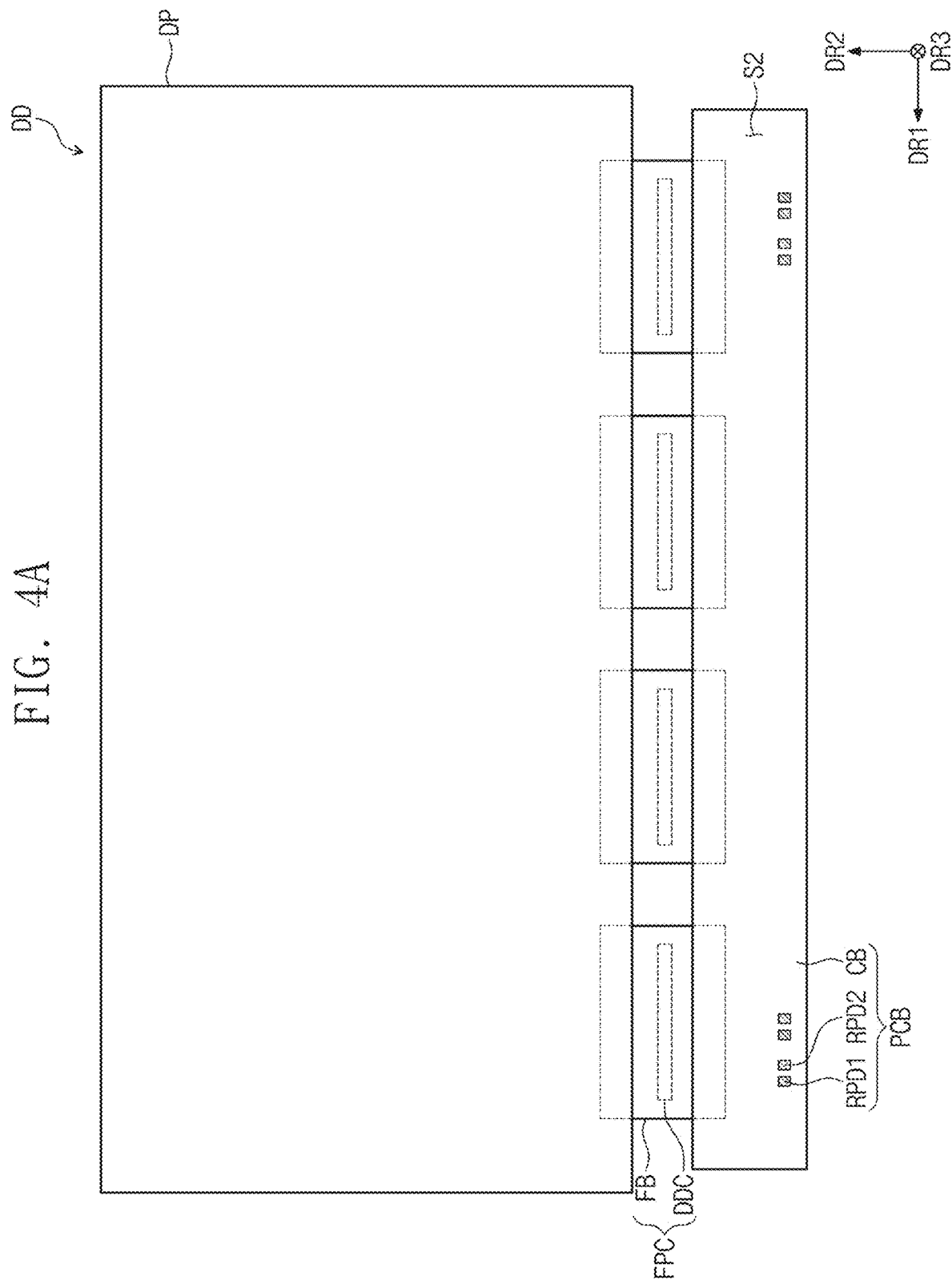

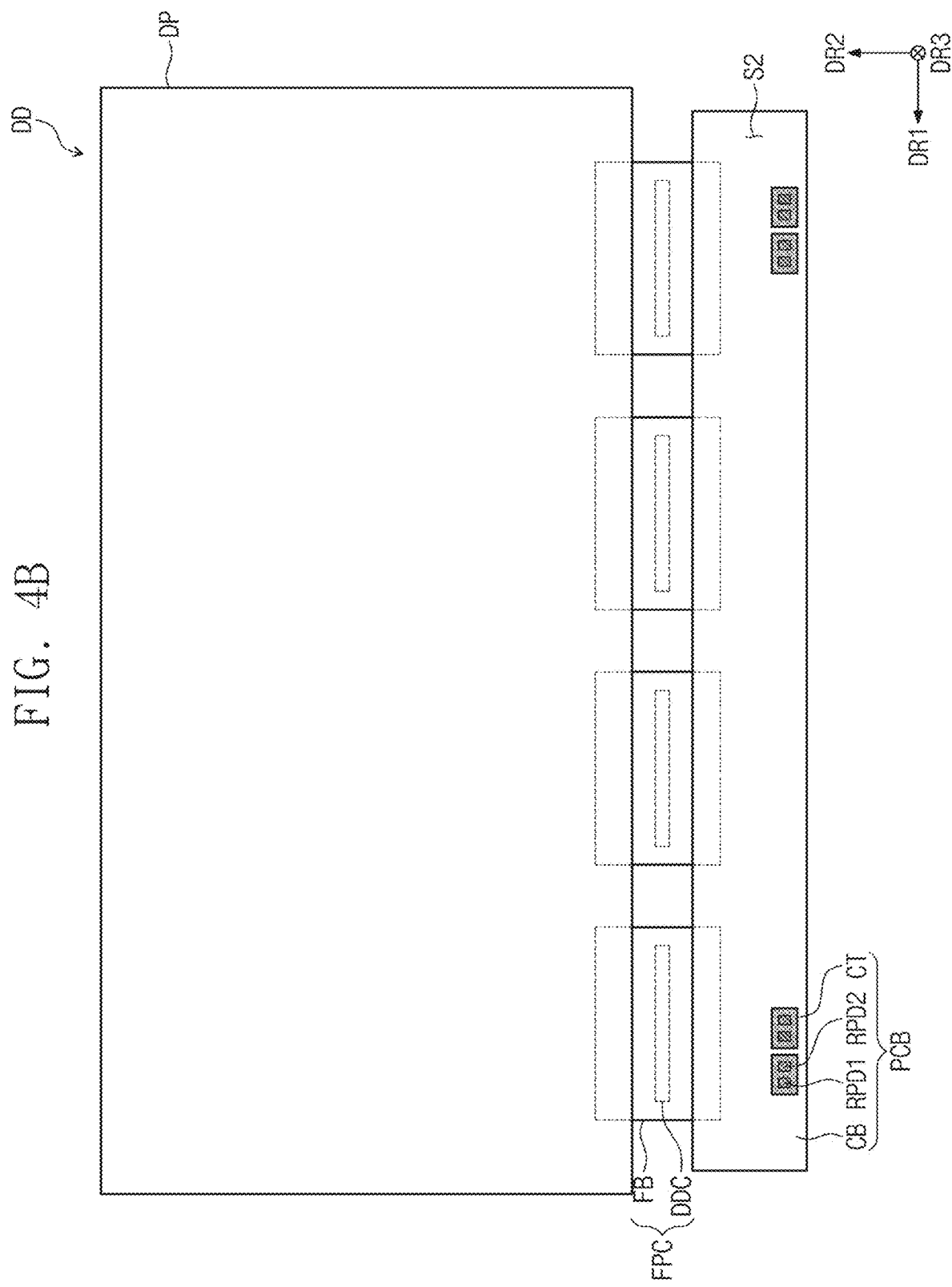

CIRCUIT BOARD AND DISPLAY DEVICE INCLUDING THE SAME

This application claims priority to Korean Patent Application No. 10-2022-0032089, filed on Mar. 15, 2022, and all the benefits accruing therefrom under 35 U.S.C. § 119, the content of which in its entirety is herein incorporated by reference.

BACKGROUND

1. Field

Embodiments of the disclosure herein relate to a circuit board, and a display device including the circuit board.

2. Description of the Related Art

A display device typically includes a display panel for displaying an image, and a circuit board connected to the display panel. The circuit board may be provided as a printed circuit board on which electronic elements for driving the display panel are mounted. The display panel may generate an image using a driving signal, which is provided by the circuit board, to display the image outwardly.

SUMMARY

Recently, as a display device with various functions has been developed, the number of electronic elements for driving the display device increases, and the electronic elements have a complex arrangement on a circuit board. However, there is a limit to increasing the area of the circuit board to mount the electronic elements. Thus, it may be desired to improve the integration density of the circuit board without increasing the area of the circuit board.

Embodiments of the disclosure provides a circuit board including resistive pads used for circuit option setting or circuit analysis, without increasing the area of the circuit board, and provides a display device including the circuit board.

An embodiment of the invention provides a circuit board including a board including a first surface and a second surface opposing the first surface, where the board includes at least one conductive layer and at least one insulating layer, a plurality of electronic elements disposed on the first surface of the board, and a plurality of resistive pads disposed on the second surface of the board and electrically connected to at least one selected from the electronic elements. In such an embodiment, the resistive pads have a resistance of zero ohm.

In an embodiment, the circuit board may further include a conductive pattern disposed on the resistive pads, and the conductive pattern may electrically connect at least two resistive pads among the resistive pads to each other.

In an embodiment, the conductive pattern may include a conductive tape having an adhesive property.

In an embodiment, the board may include a first insulating layer which defines the second surface, a plurality of opening portions may be defined through the first insulating layer, and the resistive pads may be respectively disposed in the opening portions.

In an embodiment, the first insulating layer may include a photo solder resist.

In an embodiment, the at least one conductive layer and the at least one insulating layer of the board may be each provided in plural, and a plurality of conductive layers and a plurality of insulating layers may be disposed alternately with each other. In such an embodiment, at least two conductive layers among the conductive layers may be connected to each other through a hole defined in an insulating layer disposed therebetween.

In an embodiment, the electronic elements may include at least one selected from a timing controller, a voltage generator, a resistor, an inductor, and a capacitor.

In an embodiment, the resistive pads may be electrically connected to at least one selected from the voltage generator and the timing controller.

In an embodiment of the invention, a display device includes a display panel including a display surface and a rear surface which oppose each other, a circuit board including an electronic element and a resistive pad which are disposed on different surfaces of a board, respectively, such that the electronic element and the resistive pad are disposed opposite to each other with interposing the board therebetween and electrically connected to each other through the board, and a conductive pattern disposed on the rear surface of the display panel. In such an embodiment, the resistive pad has a resistance of zero ohm.

In an embodiment, the circuit board may be disposed on the rear surface of the display panel, and the resistive pad may be in contact with the conductive pattern.

In an embodiment, the display device may further include a cover member disposed between the rear surface of the display panel and the conductive pattern to cover the rear surface of the display panel.

In an embodiment, a through-hole may be defined through the circuit board, and the through-hole may be spaced apart from the electronic element and the resistive pad on a plane.

In an embodiment, the display device may further include an alignment mark disposed in a same layer as the conductive pattern on the rear surface of the display panel, and the alignment mark may overlap the through-hole.

In an embodiment, the through-hole and the alignment mark may be each provided in plural. In such an embodiment, a plurality of alignment marks may be spaced apart from each other with the conductive pattern therebetween on a plane, and the plurality of alignment marks may respectively overlap a plurality of through-holes.

In an embodiment, the circuit board may include an insulating layer facing the rear surface of the display panel, and an opening portion may be defined through the insulating layer. In such an embodiment, the resistive pad may be disposed in the opening portion.

In an embodiment, the electronic element may include at least one selected from a timing controller, a voltage generator, a resistor, an inductor, and a capacitor.

In an embodiment, the resistive pad may be electrically connected to at least one selected from the voltage generator and the timing controller.

In an embodiment, the conductive pattern may include a conductive tape having an adhesive property.

In an embodiment, the display device may further include a flexible circuit board connected to each of the display panel and the circuit board and bent along one direction.

In an embodiment of the invention, a display device includes a display panel, and a circuit board electrically connected to the display panel. In such an embodiment, the circuit board includes a board including a first surface and a second surface opposing the first surface, a plurality of electronic elements disposed on the first surface, a plurality of resistive pads disposed on the second surface and electrically connected to at least one selected from the electronic elements, and a conductive pattern disposed on the resistive pads, where the conductive pattern electrically connects at least two resistive pads among the resistive pads to each other. In such an embodiment, the resistive pads, which are electrically connected to each other, corresponds to a zero-ohm resistor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 4A and 4B are schematic plan views of a display device according to an embodiment of the invention;

DETAILED DESCRIPTION

Figure 1:
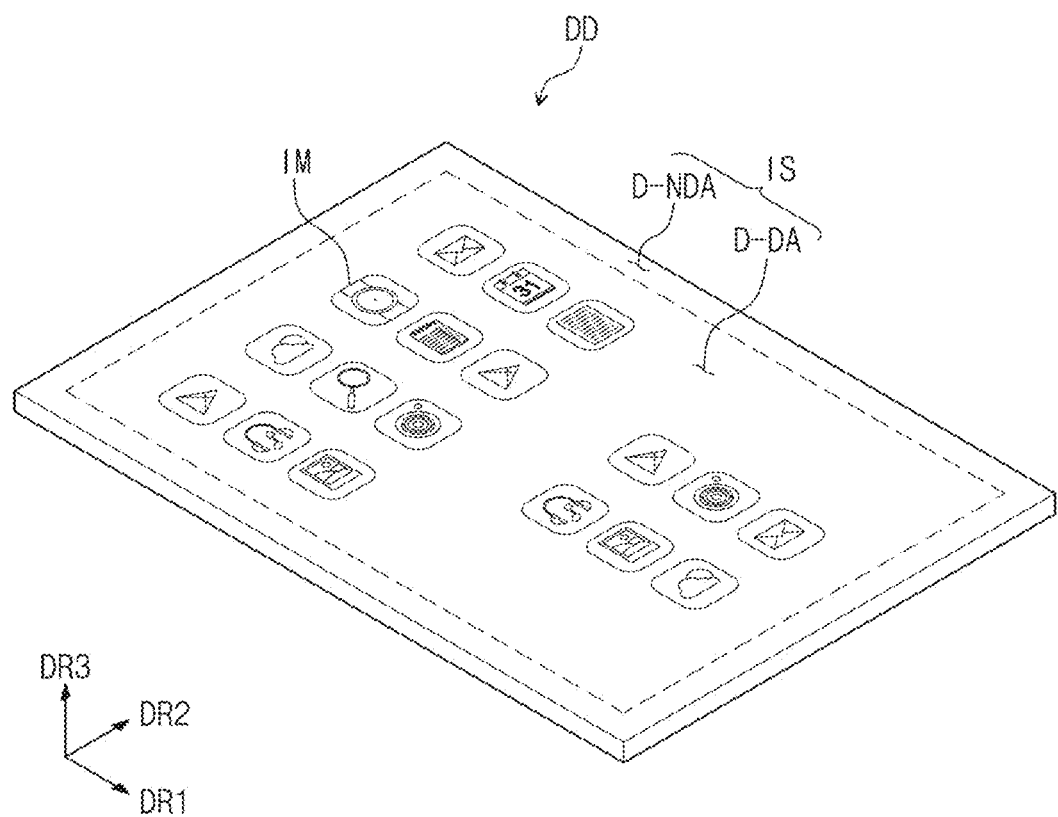
FIG. 1 is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or region, layer, section, etc.) is referred to as being "on", "connected to" or "coupled to" another element, it can be disposed directly on, connected or coupled to the other element or a third intervening element may be disposed between the elements.

Like reference numbers or symbols refer to like elements throughout. In addition, in the drawings, the thickness, the ratio, and the dimension of elements are exaggerated for effective description of the technical contents.

It will be understood that, although the terms first, second, etc. may be used herein to describe various elements, these elements should not be limited by these terms. These terms are only used to distinguish one element from another element. For example, a first element could be termed a second element without departing from the teachings of the invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concept and are explained based on the direction shown in the drawing.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
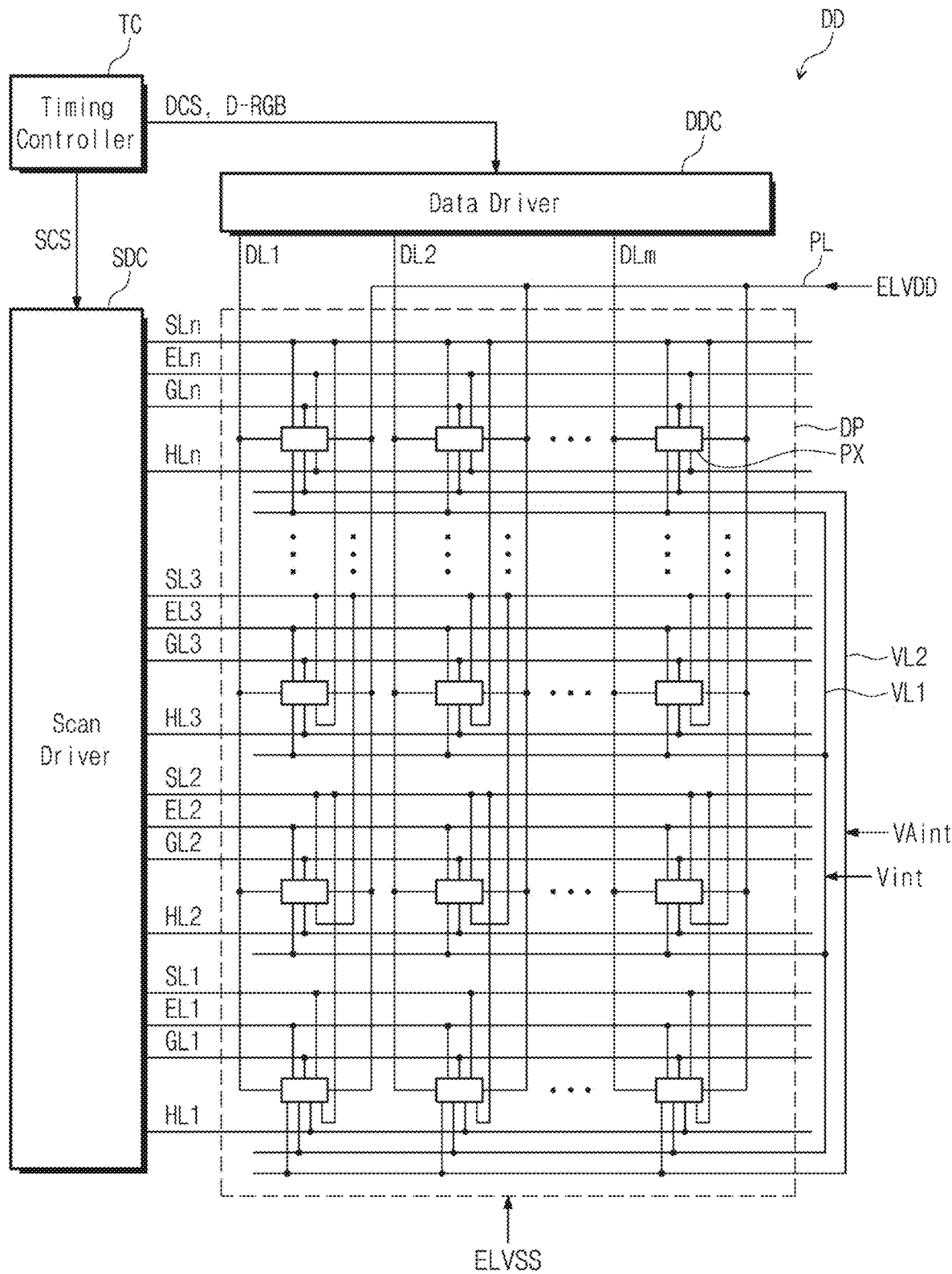
FIG. 2 is a block diagram of the display device according to an embodiment of the invention.

FIG. 1 is a perspective view of a display device according to an embodiment. FIG. 2 is a block diagram of the display device according to an embodiment.

An embodiment of a display device DD may be a device that is activated in response to an electrical signal and displays an image IM. Embodiments of the display device DD may include various types of device that provide a user with the image IM. In an embodiment, for example, the display device DD may be a large-sized device such as a television or an outdoor billboard, and may also be a small and medium-sized device such as a monitor, a mobile phone, a tablet computer, a navigation device, or a game console. The embodiments of the display device DD are examples, and the display device DD is not limited to any one unless departing from the teachings herein.

Referring to FIG. 1, an embodiment of the display device DD may have a rectangular shape with long sides extending in a first direction DR1 and short sides extending in a second direction DR2 on a plane. However, an embodiment of the invention is not limited thereto, and the display device DD may have various shapes such as a circular shape or a polygon shape, on a plane.

The display device DD may display the image IM in a third direction DR3 through a display surface IS parallel to a plane defined by the first direction DR1 and the second direction DR2. The third direction DR3 may be substantially parallel to a normal direction of the display surface IS or a thickness direction of the display device DD. The display surface IS, on which the image IM is displayed, may correspond to a front surface of the display device DD. The image IM may include not only a dynamic image but also a still image. FIG. 1 illustrates an embodiment where the image IM includes icon images, for example.

In an embodiment, a front surface (or upper surface) and a rear surface (or lower surface) of each member (or unit) may be defined based on a direction in which the image IM is displayed. The front surface and the rear surface may oppose each other in the third direction DR3, and a normal direction of each of the front surface and the rear surface may be parallel to the third direction DR3. A spaced distance between the front surface and the rear surface, which is defined along the third direction DR3, may correspond to the thickness of the member (or unit).

The term "on a plane" used herein may be defined as a state as seen in the third direction DR3. The term "on a cross section" used herein may be defined as a state as seen in the first direction DR1 or the second direction DR2. Here, directions indicated by the first to third directions DR1, DR2, and DR3 are relative concepts and may be changed to other directions.

The display device DD may be flexible. The term "flexible" refers to a characteristic of being capable of bending, and may include all from a fully folded structure to a structure capable of bending at the level of several nanometers. In an embodiment, for example, the flexible display device DD may be a curved device or a foldable device. However, an embodiment of the invention is not limited thereto, and the display device DD may be rigid.

FIG. 1 illustrates the display device DD having a flat display surface IS as an example. However, an embodiment of the invention is not limited thereto, and the display surface IS of the display device DD may have a curved shape or a three-dimensional shape.

The display surface IS of the display device DD may include a display part D-DA and a non-display part D-NDA. The display part D-DA may be a part on which the image IM is displayed within the front surface of the display device DD.

The image IM may be visible to a user through the display part D-DA. In this embodiment, the display part D-DA having a rectangular shape on a plane is illustrated as an example, but the display part D-DA may have various shapes depending on the design of the display device DD.

The non-display part D-NDA may be a part on which the image IM is not displayed within the front surface of the display device DD. The non-display part D-NDA may be a part which has a predetermined color and shields light. The non-display part D-NDA may be adjacent to the display part D-DA. In an embodiment, for example, the non-display part D-NDA may be disposed outside the display part D-DA to surround the display part D-DA. However, this is illustrated as an example, and the non-display part D-NDA may be adjacent to only one side of the display part D-DA, or may be disposed on a side surface of the display device DD, not on the front surface. However, an embodiment of the invention is not limited thereto, and alternatively, the non-display part D-NDA may be omitted.

The display device DD according to an embodiment may detect an external input applied from an outside. The external input may include various types such as pressure, temperature, and light provided from the outside. The external input may include not only an input by touching the display device DD (e.g., touch by the user's hand or pen) but also an input (e.g., hovering) applied by being adjacent to the display device DD.

Referring to FIG. 2, an embodiment of the display device DD may include a timing controller TC, a scan driver SDC, a data driver DDC, and a display panel DP. At least one selected from the timing controller TC, the scan driver SDC, or the data driver DDC may be provided as a driving chip or may be formed directly in the display panel DP.

The display panel DP according to an embodiment may be a light-emitting display panel, and is not particularly limited thereto. In an embodiment, for example, the display panel DP may be an organic light-emitting display panel, an inorganic light-emitting display panel, or a quantum-dot light-emitting display panel. An emission layer of the organic light-emitting display panel may include an organic light-emitting material, and an emission layer of the inorganic light-emitting display panel may include an inorganic light-emitting material. An emission layer of the quantum-dot light-emitting display panel may include a quantum dot, a quantum rod, etc. Hereinafter, for convenience of description, embodiments where the display panel DP is the organic light-emitting display panel will be described in detail.

The timing controller TC may receive input image signals, and generate image data D-RGB by converting a data format of the input image signals to match an interface specification of the scan driver SDC. The timing controller TC may output the image data D-RGB and various types of control signals DCS and SCS.

The scan driver SDC may receive a scan control signal SCS from the timing controller TC. The scan control signal SCS may include a vertical start signal for starting an operation of the scan driver SDC, a clock signal for determining an output timing of signals, and so on.

The scan driver SDC may generate scan signals, and sequentially output the scan signals to corresponding scan lines SL1 to SLn, GL1 to GLn and HL1 to HLn. The scan driver SDC may generate emission control signals in response to the scan control signal SCS, and output the emission control signals to corresponding emission lines EL1 to ELn. Here, n is a natural number greater than 1.

FIG. 2 illustrates an embodiment where the scan signals and the emission control signals are output from a single scan driver SDC. However, an embodiment is not limited thereto. For example, in an alternative embodiment, a driving circuit that generates and outputs the scan signals, and a driving circuit that generates and outputs the emission control signals, may be separately provided.

The data driver DDC may receive a data control signal DCS and the image data D-RGB from the timing controller TC. The data driver DDC may convert the image data D-RGB into data signals, and output the data signals to data lines DL1 to DLm. The data signals may be analog voltages corresponding to grayscale values of the image data D-RGB.

The display panel DP may include multiple groups of signal lines. In an embodiment of the disclosure, any one among the multiple groups of signal lines is defined as a first signal line, another may be defined as a second signal line, and still another may be defined as a third signal line. Hereinafter, the multiple groups of signal lines will be defined or described in greater detail.

The display panel DP may include a first group of scan lines SL1 to SLn, a second group of scan lines GL1 to GLn, a third group of scan lines HL1 to HLn, the emission lines EL1 to ELn, the data lines DL1 to DLm, a first voltage line PL, a second voltage line VL1, and a third voltage line VL2.

The data lines DL1 to DLm may be insulated from and intersect with the first group of scan lines SL1 to SLn, the second group of scan lines GL1 to GLn, the third group of scan lines HL1 to HLn, and the emission lines EL1 to ELn. The first voltage line PL, the second voltage line VL1, and the third voltage line VL2 may be designed as voltage lines which are independent of each other. However, an embodiment of the signal lines constituting the display panel DP is not limited thereto, and various modifications may be made depending on the configuration of a driving circuit of pixels PX.

Each of a plurality of pixels PX may be electrically connected to corresponding signal lines among the signal lines described above. Each of the pixels PX may be connected to a corresponding scan line among the first to third groups of scan lines SL1 to SLn, GL1 to GLn, and HL1 to HLn, a corresponding emission line among the emission lines EL1 to ELn, and a corresponding data line among the data lines DL1 to DLm. A connection structure for the pixels PX and the signal lines may be changed or modified depending on the configuration of the driving circuit of the pixels PX.

Each of the pixels PX may be connected to the first voltage line PL to receive a first power supply voltage ELVDD applied to the first voltage line PL. The first power supply voltage ELVDD may have a higher level than a second power supply voltage ELVSS received by the pixels PX.

Each of the pixels PX may be connected to the second voltage line VL1 to receive a first initialization voltage Vint applied to the second voltage line VL1. Each of the pixels PX may be connected to the third voltage line VL2 to receive a second initialization voltage VAint applied to the third voltage line VL2. Each of the first initialization voltage Vint and the second initialization voltage VAint may have a lower level than the first power supply voltage ELVDD. Each of the first initialization voltage Vint and the second initialization voltage VAint may be a bias voltage having a certain level. In an embodiment, the first initialization voltage Vint and the second initialization voltage VAint may have different levels from each other. In an embodiment, for example, the second initialization voltage VAint may have a lower level than the first initialization voltage Vint.

The display panel DP may display an image in response to an electrical signal. Each of the pixels PX constituting the display panel DP may include an organic light-emitting element, and a driving circuit which controls light emission of the organic light-emitting element. The driving circuit may include a plurality of thin film transistors and at least one capacitor. At least one selected from the scan driver SDC and the data driver DDC may include thin film transistors formed through a same process as the driving circuit of the pixels PX. However, an embodiment is not limited thereto.

The pixels PX may receive data voltages in response to the scan signals. The pixels PX may display an image by emitting light with brightness corresponding to the data voltages in response to emission signals. An emission time of the pixels PX may be controlled by the emission signals. In the display panel DP, the image may be output by the pixels PX.

The pixels PX may include a plurality of groups which generate light having different colors from each other. In an embodiment, for example, the pixels PX may include red pixels for generating red light, green pixels for generating green light, and blue pixels for generating blue light. A light-emitting element of the red pixel, a light-emitting element of the green pixel, and a light-emitting element of the blue pixel may each include an emission layer, and a material forming the emission layer may vary depending on the color of the light generated by the pixels PX. However, the color of the light generated by the pixels PX is not limited to those described above.

Figure 3A:
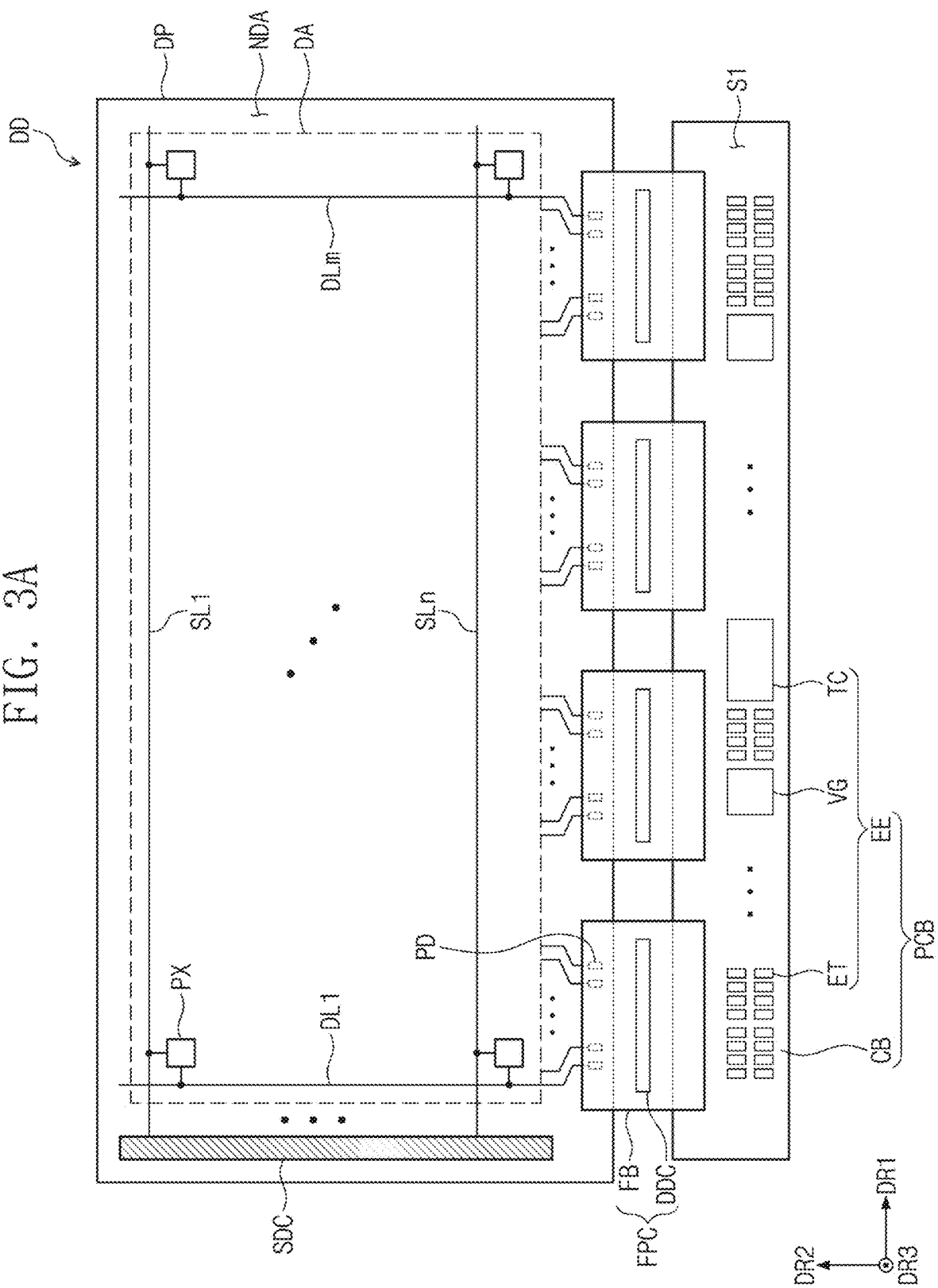
FIGS. 3A and 3B are schematic plan views of a display device according to an embodiment of the invention.
Figure 3B:
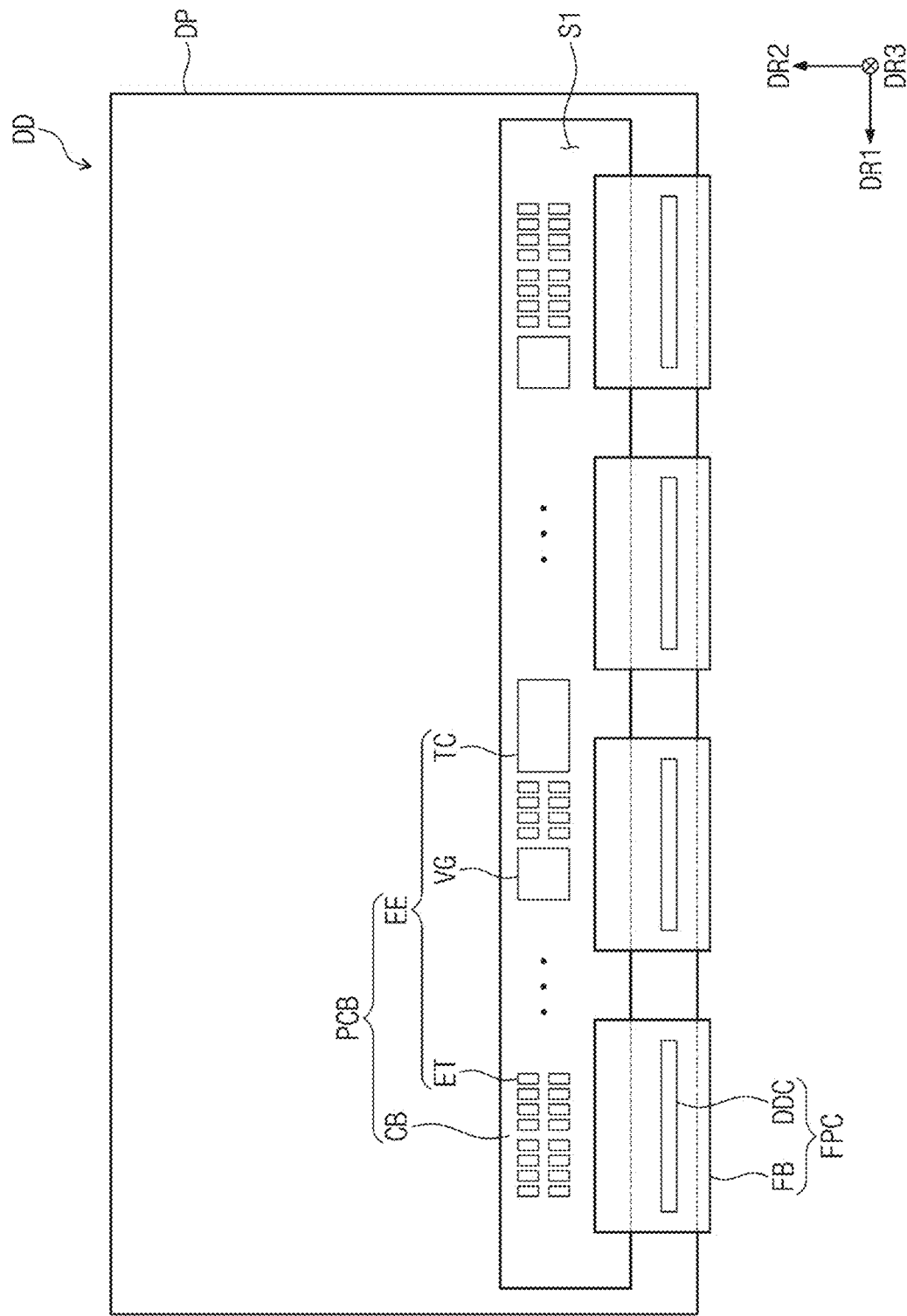

FIGS. 3A and 3B are schematic plan views of a display device according to an embodiment. FIG. 3A illustrates a schematic plan view of a display device DD as seen on a front surface of a display panel DP, and FIG. 3B illustrates a schematic plan view of the display device DD as seen on a rear surface of the display panel DP.

FIG. 3A is a schematic plan view illustrating the display panel DP including the first group of scan lines SL1 to SLn (hereinafter referred to as the scan lines) and the data lines DL1 to DLm, which are connected to the pixels PX, among the signal lines described above.

Referring to FIG. 3A, an embodiment of the display panel DP may include a display area DA and a non-display area NDA. The display panel DP may include pixels PX disposed in the display area DA, the scan lines SL1 to SLn and the data lines DL1 to DLm electrically connected to the pixels PX, and a scan driver SDC disposed in the non-display area NDA. In such an embodiment, the pixels PX, the scan lines SL1 to SLn, the data lines DL1 to DLm and a scan driver SDC are substantially the same as those described above, and any repetitive detailed description thereof will be omitted.

Referring to FIG. 3A, the display panel DP may include pads PD disposed along one direction on the non-display area NDA. The pads PD may be disposed adjacent to a lower end of the non-display area NDA. Each of the data lines DL1 to DLm may be electrically connected to a corresponding pad PD among the pads PD. The pads PD may be parts to which a circuit board to be described later is connected.

According to an embodiment of the invention, the display device DD may include a flexible circuit board FPC electrically connected to the pads PD of the display panel DP, and a circuit board PCB electrically connected to the flexible circuit board FPC. The circuit board PCB may be provided as a printed circuit board.

In an embodiment, the flexible circuit board FPC may be provided in plural, and a plurality of flexible circuit boards FPC may be disposed along one direction. Each of the flexible circuit boards FPC may be connected to the pads PD of the display panel DP. The number of the flexible circuit boards FPC included in the display device DD is not limited those shown in the drawing. In an alternative embodiment, for example, the display device DD may include a single flexible circuit board FPC.

The flexible circuit board FPC may include a base film FB, and a data driver DDC mounted on the base film FB. The base film FB may include an insulating and flexible material. In an embodiment, for example, the base film FB may include a polymer material such as polyimide (PI), polyethylene terephthalate (PET), and polyethylene naphthalate (PEN). However, the material of the base film FB is not limited to those described above.

The base film FB may have flexibility and accordingly, the flexible circuit board FPC may be bent toward the rear surface of the display panel DP. FIG. 3A illustrates the flexible circuit board FPC and the circuit board PCB as seen on the front surface of the display panel DP before the flexible circuit board FPC is bent. FIG. 3B illustrates the flexible circuit board FPC and the circuit board PCB as seen on the rear surface of the display panel DP after the flexible circuit board FPC is bent toward the rear surface of the display panel DP.

The flexible circuit board FPC may include output pads, input pads, and connection lines which are disposed on the base film FB. The output pads of the flexible circuit board FPC may be respectively connected to the pads PD of the display panel DP, and the input pads of the flexible circuit board FPC may be connected to the circuit board PCB. The connection lines of the flexible circuit board FPC may respectively connect the output pads to the data driver DDC and the input pads to the data driver DDC. The flexible circuit board FPC may provide the display panel DP with an electrical signal provided by the circuit board PCB and the data driver DDC.

One end of the circuit board PCB may be electrically connected to the flexible circuit board FPC. However, an embodiment of the invention is not limited thereto. According to an alternative embodiment of the invention, the flexible circuit board FPC may be omitted. In such an embodiment, the circuit board PCB may be connected directly to the pads PD of the display panel DP. In such an embodiment, the data driver DDC may be mounted on the non-display area NDA of the display panel DP or may be mounted on the circuit board PCB.

Referring to FIG. 3A, the circuit board PCB may include electronic elements EE, and a board CB on which the electronic elements EE are mounted. Although not illustrated in FIG. 3A, the circuit board PCB may include connection pads respectively electrically connected to the input pads of the flexible circuit board FPC.

The board CB may include a first surface S1, and a second surface S2 (see FIG. 4A). Each of the first surface S1 and the second surface S2 (see FIG. 4A) may be a surface parallel to each of the first direction DR1 and the second direction DR2. The first surface S1 and the second surface S2 (see FIG. 4A) may oppose each other in the third direction DR3. That is, the second surface S2 (see FIG. 4A) may correspond to a surface opposite to the first surface S1.

The electronic elements EE may be disposed on the first surface S1 of the board CB. That is, the first surface S1 of the board CB may be provided as the mounting surface of the electronic elements EE. The electronic elements EE may be elements that drive the pixels PX of the display panel DP. The connection pads of the circuit board PCB, which are connected to the input pads of the flexible circuit board FPC, may also be disposed on the first surface S1 of the board CB.

The electronic elements EE may include a voltage generator VG, a timing controller TC, and a plurality of elements ET. The voltage generator VG may generate a voltage to be applied to the pixels PX. The voltage generated by the voltage generator VG may be applied to each of the voltage lines PL1, VL1 and VL2 (see FIG. 2) described above. The timing controller TC may control operations of the scan driver SDC and the data driver DDC. The timing controller TC may generate a scan control signal, a data control signal, and an emission control signal in response to control signals received from the outside. The plurality of elements ET may include electronic elements such as a resistor, an inductor, and a capacitor. In an embodiment, the timing controller TC, the voltage generator VG, and the plurality of elements ET may be referred to as electronic components. The electronic elements EE are not limited to any specific one as long as being an element constituting a driving circuit for driving the pixels PX.

Referring to FIG. 3B, as the flexible circuit board FPC is bent toward the rear surface of the display panel DP, the circuit board PCB may overlap the display panel DP on a plane. The first surface S1 of the board CB may face outwardly on the rear surface of the display panel DP, and the second surface S2 (see FIG. 4A) of the board CB may face the rear surface of the display panel DP.

FIGS. 4A and 4B are schematic plan views of a display device according to an embodiment. FIGS. 4A and 4B illustrate a display panel DP and a circuit board PCB as seen on a rear surface of the display panel DP before a flexible circuit board FPC is bent.

Referring to FIG. 4A, the circuit board PCB may include resistive pads RPD1 and RPD2 disposed on a second surface S2 of a board CB. The resistive pads RPD1 and RPD2 may be disposed or formed on a surface opposite to the surface on which the electronic elements EE (see FIG. 3A) of the circuit board PCB are mounted.

The resistive pads RPD1 and RPD2 may be provided in the form of a pad having a predetermined planar area on a plane. The resistive pads RPD1 and RPD2 may be disposed apart from each other along one direction, or may be disposed in a matrix form. The arrangement form of the resistive pads RPD1 and RPD2 is not limited to any specific one as long as the resistive pads RPD1 and RPD2 are disposed on a surface opposite to the surface on which the electronic elements EE (see FIG. 3A) are mounted.

In a case where the resistive pads RPD1 and RPD2 are formed on the first surface S1 (see FIG. 3A) the same as the surface on which the electronic elements EE (see FIG. 3A) are mounted, an additional space may be used to dispose the resistive pads RPD1 and RPD2 on the board CB and consequently, the area of the circuit board PCB may be increased. In an embodiment of the invention, the resistive pads RPD1 and RPD2 may be disposed or formed on a surface opposite to the mounting surface of the electronic elements EE (see FIG. 3A), thereby providing or disposing the resistive pads RPD1 and RPD2 within the circuit board PCB without increasing the area of the board CB.

The resistive pads RPD1 and RPD2 may include a conductive material. In an embodiment, for example, the resistive pads RPD1 and RPD2 may include copper. However, the material of the resistive pads RPD1 and RPD2 is not limited thereto.

The resistive pads RPD1 and RPD2 may be electrically connected to at least one of the electronic elements EE (see FIG. 3A). In an embodiment, for example, the resistive pads RPD1 and RPD2 may be electrically connected to a timing controller TC or a voltage generator VG.

The resistive pads RPD1 and RPD2 may be electrically connected to the electronic elements EE (see FIG. 3A) through signal lines included in the circuit board PCB. In an embodiment, for example, the resistive pads RPD1 and RPD2 may be electrically connected to a signal line for applying a power supply voltage to the pixels PX (see FIG. 2), or may be electrically connected to a signal line for delivering a clock signal. The component, which is electrically connected to the resistive pads RPD1 and RPD2, may be variously changed depending on the design of a driving circuit. In addition, the number of the resistive pads RPD1 and RPD2, which are included in the circuit board PCB, may be variously changed depending on the configuration of the driving circuit.

Referring to FIG. 4B, in an embodiment, the circuit board PCB may further include a conductive pattern CT disclosed on the resistive pads RPD1 and RPD2. The conductive pattern CT may be provided in plural, and a plurality of conductive patterns CT may be disposed apart from each other on the second surface S2 of the board CB.

Each of the conductive patterns CT may electrically connect at least two resistive pads RPD1 and RPD2, among the resistive pads RPD1 and RPD2, to each other. In such an embodiment, each of the conductive patterns CT may be in contact with the resistive pads RPD1 and RPD2, which are electrically connected to the driving circuit, to short-circuit the resistive pads RPD1 and RPD2.

The resistive pads RPD1 and RPD2, which are electrically connected by the conductive pattern CT, may be disposed adjacent to each other along one direction. In such an embodiment where the resistive pads RPD1 and RPD2 connected by the conductive pattern CT are formed adjacent to each other, the length of the conductive pattern CT may be minimized and the cost for forming the conductive pattern CT may be saved.

Each of the conductive patterns CT may be provided in the form of a conductive tape, and may be attached onto the resistive pads RPD1 and RPD2. In such an embodiment where the conductive patterns CT include a conductive tape, the attachment/detachment of the conductive patterns CT may be easily performed on the resistive pads RPD1 and RPD2. Accordingly, a rework of the circuit board PCB may be easily performed during manufacture and supply of the circuit board PCB, thereby improving manufacturing efficiency of the circuit board PCB and reducing manufacturing costs. However, the form in which the conductive patterns CT are provided is not limited to any specific one as long as the conductive patterns CT may electrically connect at least two resistive pads among the resistive pads RPD1 and RPD2 to each other.

Each of the resistive pads RPD1 and RPD2 may have a resistance of zero ohm. Accordingly, the resistive pads RPD1 and RPD2, which are electrically connected to each other by the conductive pattern CT, may bring about the same effect as when mounting a zero-ohm resistor in the circuit board PCB. Here, the zero-ohm resistor means an element having a resistance value, which is substantially close to zero, and accordingly, a current flowing therethrough or a voltage across the zero-ohm resistor may hardly affected by change in magnitude.

The resistive pads RPD1 and RPD2 may be disposed on the second surface S2 of the board CB, and thus the circuit board PCB may achieve, without mounting the zero-ohm resistor, the same or similar effect as in a case where a zero-ohm resistor is connected. Accordingly, a separate space for mounting the zero-ohm resistor may be omitted in the circuit board PCB, and the processing cost for mounting the zero-ohm resistor may be saved.

In an embodiment, the resistive pads RPD1 and RPD2, which are electrically connected to each other, may serve as a short circuit path which connects signal lines respectively connected to the resistive pads RPD1 and RPD2. Accordingly, the signal lines may be minimized from extending long for mutual connection while bypassing another signal line or electronic elements, and the space of the board CB may be efficiently used. In addition, the path of the signal lines may be shortened, thereby reducing noise and preventing property degradation of the electronic elements EE.

In an embodiment, the resistive pads RPD1 and RPD2 may serve as a switch in the driving circuit. That is, the resistive pads RPD1 and RPD2 may function as an option pad. In an embodiment, for example, the driving circuit may include an option circuit, an option signal line, or the like (hereinafter referred to as the option circuit), which is optionally required for electrical connection as necessary, and signal lines of the option circuit may be connected to the resistive pads RPD1 and RPD2. Whether or not to electrically connect the option circuit in the driving circuit may be determined depending on product specification, performance test results, etc. When the option circuit is attempted to be connected, the conductive pattern CT may be used to electrically connect the resistive pads RPD1 and RPD2, which are connected to the signal lines of the option circuit, to the resistive pads RPD1 and RPD2 which are connected to a voltage line. When a test result indicates that the option circuit is not used, the option circuit may be insulated by opening the conductive pattern CT which is connected to the resistive pads RPD1 and RPD2 electrically connected to the option circuit.

In an embodiment, the resistive pads RPD1 and RPD2 may be used to inspect the driving circuit or detect a defect. In an embodiment, for example, an inspection device may be used to measure a value of a current flowing through or a voltage across the resistive pads RPD1 and RPD2 electrically connected by the conductive pattern CT, thereby inspecting whether a defect occurs in a point electrically connected to the resistive pads RPD1 and RPD2.

The resistive pads RPD1 and RPD2 may be respectively connected to voltage lines, which are electrically connected to a single power supply, to separate the power supply. Accordingly, the resistive pads RPD1 and RPD2 may reduce the occurrence of noise between the voltage lines connected to the single power supply.

According to an embodiment of the invention, instead of mounting zero-ohm resistors on portions of the driving circuit, which is typically used with a short circuit path, an option pad, an inspection pad, or a power supply separation, the resistive pads RPD1 and RPD2 formed in the circuit board PCB may be connected to the driving circuit, thereby reducing the number of components by not providing the zero-ohm resistors that are mounted on the board CB of the circuit board PCB. Thus, the processing cost for manufacturing the circuit board PCB may be reduced. In such an embodiment, the resistive pads RPD1 and RPD2 may be disposed on a surface opposite to the mounting surface of the electronic elements EE, thereby achieving, without a limitation in space, a same effect as a case where the zero-ohm resistors are provided in the circuit board PCB.

Figure 5:
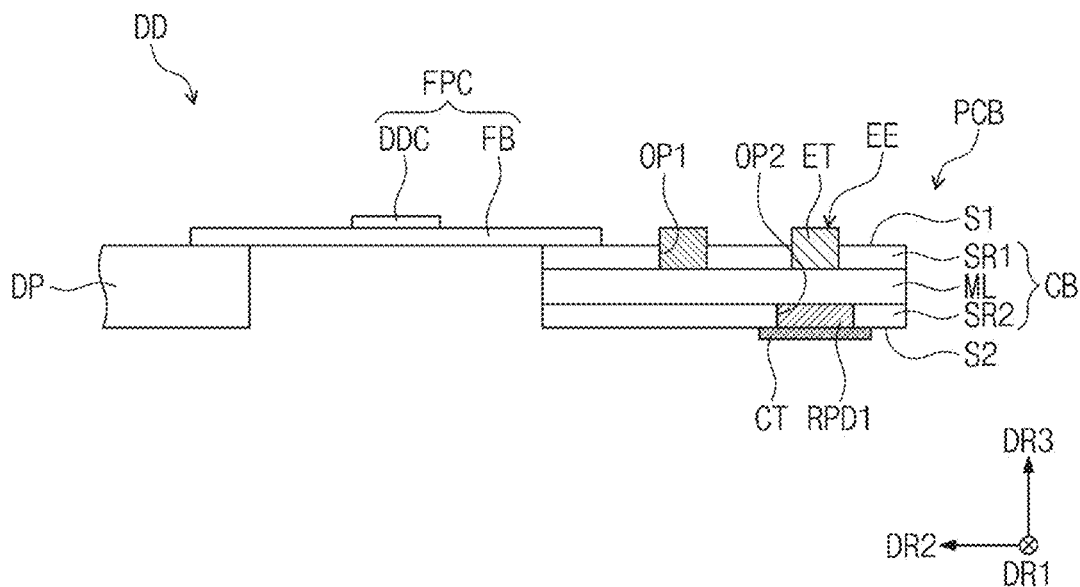
FIG. 5 is a cross-sectional view of a display device according to an embodiment of the invention.

FIG. 5 is a cross-sectional view of a display device according to an embodiment. FIG. 5 is a schematic cross-sectional view illustrating a portion of a display device DD as seen in the first direction DR1.

Referring to FIG. 5, one end (or a first send) of a flexible circuit board FPC may be electrically connected to a display panel DP, and another end (or a second end opposite to the first end) of the flexible circuit board FPC may be electrically connected to a circuit board PCB. However, an embodiment of the invention is not limited thereto. According to an alternative embodiment of the invention, the flexible circuit board FPC may be omitted, and in such an embodiment, the circuit board PCB may be connected directly to one end of the display panel DP.

A board CB of the circuit board PCB may include a first insulating layer SR1 which defines a first surface S1, a second insulating layer SR2 which defines a second surface S2, and an intermediate layer ML which are disposed between the first and second insulating layers SR1 and SR2. The first insulating layer SR1 may include first opening portions OP1 (i.e., the first opening portions OP1 are defined in the first insulating layer SR1), and the second insulating layer SR2 may include second opening portions OP2. The first opening portions OP1 may each be formed by removing a portion of the first insulating layer SR1, and the second opening portions OP2 may each be formed by removing a portion of the second insulating layer SR2. An upper surface of the first insulating layer SRL and one surface of the intermediate layer ML exposed by the first opening portions OP1, may define the first surface S1 of the board CB. A lower surface of the second insulating layer SR2, and another surface of the intermediate layer ML exposed by the second opening portions OP2, may define the second surface S2 of the board CB.

Electronic elements EE, which are mounted on the first surface S1 of the board CB, may respectively overlap the first opening portions OP1 of the first insulating layer SR1. The resistive pads RPD1 and RPD2 (see FIG. 4A), which are disposed on the second surface S2 of the board CB, may respectively overlap the second opening portions OP2 of the second insulating layer SR2. The resistive pads RPD1 and RPD2 (see FIG. 4A) may be respectively disposed in the second opening portions OP2.

Each of the first insulating layer SR1 and the second insulating layer SR2 may include a photo solder resist PSR. Accordingly, the first insulating layer SR1 and the second insulating layer SR2 may prevent conductive layers of the circuit board PCB from being oxidized in air or damaged by a foreign matter. In addition, the first insulating layer SR1 and the second insulating layer SR2 may prevent the occurrence of an unexpected short circuit between adjacent electronic elements EE.

Referring to FIG. 5, a conductive pattern CT may be disposed on the resistive pad RPD1. The conductive pattern CT may be in contact with an upper surface of the resistive pad RPD1. Here, the upper surface of the resistive pad RPD1 may be a surface exposed by the second opening portion OP2. The planar area of the conductive pattern CT may be larger than the planar area of the resistive pad RPD1, and may cover the entirety of the upper surface of the resistive pad RPD1. Accordingly, a portion of the conductive pattern CT may be disposed on the second insulating layer SR2.

The resistive pad RPD1 may be disposed on the second surface S2 of the board CB so that the resistive pad RPD1 may overlap, on a plane, some electronic elements among the electronic elements EE disposed on the first surface S1 of the board CB. FIG. 5 illustrates an embodiment where the resistive pad RPD1 overlaps an element ET. However, an embodiment is not limited thereto.

In a case where all of the resistive pad RPD1 and the electronic elements EE are formed on a same first surface S1 of the board CB, the resistive pad RPD1 and the electronic elements EE may not be disposed overlapping each other on a plane, and the area of the board CB is desired to be increased to dispose the resistive pad RPD1 and the electronic elements EE. In an embodiment, the resistive pad RPD1 and the electronic elements EE may be respectively disposed on surfaces, opposite to each other, of the board CB such that the resistive pad RPD1 and some of the electronic elements EE may be allowed to be disposed to overlap each other on a plane, and the space of the board CB may be efficiently used to dispose the resistive pad RPD1 and the electronic elements EE.

Figure 6:
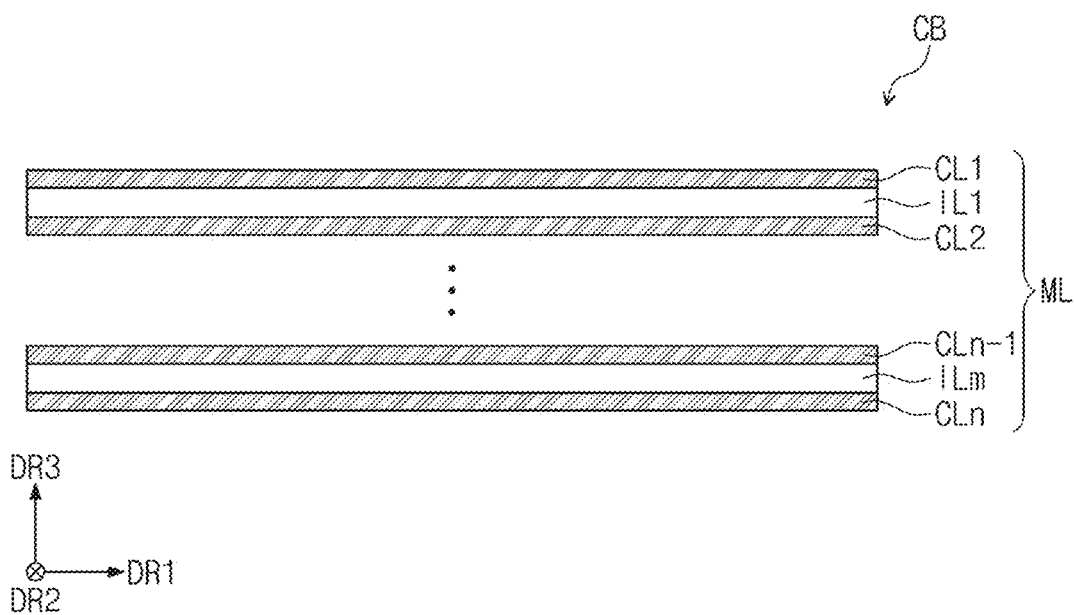
FIG. 6 is a cross-sectional view of some components of a circuit board according to an embodiment of the invention.

FIG. 6 is a cross-sectional view of some components of a circuit board according to an embodiment. FIG. 6 illustrates a configuration of an intermediate layer ML, which is disposed between the first and second insulating layers SR1 and SR2 in FIG. 5, among components of a board CB.

The board CB may include at least one insulating layer and at least one conductive layer. Referring to FIG. 6, the intermediate layer ML of the board CB may include a plurality of conductive layers CL1 to CLn and a plurality of insulating layers IL1 to ILm, which are alternately disposed along a thickness direction of the board CB or alternately stacked one on another. Here, n and m are natural numbers.

For convenience of description, a conductive layer, which is disposed on an uppermost side of the intermediate layer ML, will be referred to as a first conductive layer CL1, and a conductive layer, which is disposed on a lowest side of the intermediate layer ML, will be referred to as an n-th conductive layer CLn. The first insulating layer SR1 in FIG. 5 may be disposed on an upper surface of the first conductive layer CL1, and the second insulating layer SR2 in FIG. 5 may be disposed on a lower surface of the n-th conductive layer CLn.

The first conductive layer CL1 may include mounting parts which provide a region for mounting the electronic elements EE thereon (see FIG. 3A), and signal lines which are electrically connected to the electronic elements EE (see FIG. 3A). The n-th conductive layer CLn may include signal lines which are electrically connected to the resistive pads RPD1 and RPD2 (see FIG. 4A). The resistive pads RPD1 and RPD2 (see FIG. 4A) may include a same material as the n-th conductive layer CLn. However, an embodiment is not limited thereto.

The board CB may include conductive layers CL2 to CLn−1 which are disposed between the first conductive layer CL1 disposed on the uppermost side and the n-th conductive layer CLn disposed on the lowermost side. Each of the conductive layers CL2 to CLn−1 may include signal lines that constitute a driving circuit. That is, the signal lines, which are included in the conductive layers CL2 to CLn−1, may correspond to signal lines embedded in the board CB. Some of the signal lines (or at least two conductive layers) disposed in different layers from each other may be connected to each other through a via-hole defined through an insulating layer disposed therebetween. According to such an embodiment of the driving circuit, the first conductive layer CL1 and the n-th conductive layer CLn may be electrically connected, through the via-hole passing through at least one insulating layer, to the signal lines which are included in the conductive layers CL2 to CLn−1 disposed between the first conductive layer CL1 and the n-th conductive layer CLn.

The board CB may include the signal lines embedded therein, thereby improving the integration density of the circuit board PCB, and providing the driving circuit having a complex configuration without increasing the area of the circuit board PCB.

However, an embodiment of the invention is not limited thereto. In an alternative embodiment, the n-th conductive layer CLn may correspond to a second conductive layer CL2, and the intermediate layer ML of the board CB may include a single insulating layer, and the first conductive layer CL1 and the second conductive layer CL2 which are respectively disposed on two opposing surfaces of the insulating layer. In such an embodiment, some of components, which are included in the first conductive layer CL1 and the second conductive layer CL2, may be electrically connected through a via-hole passing through the single insulating layer.

Figure 7A:
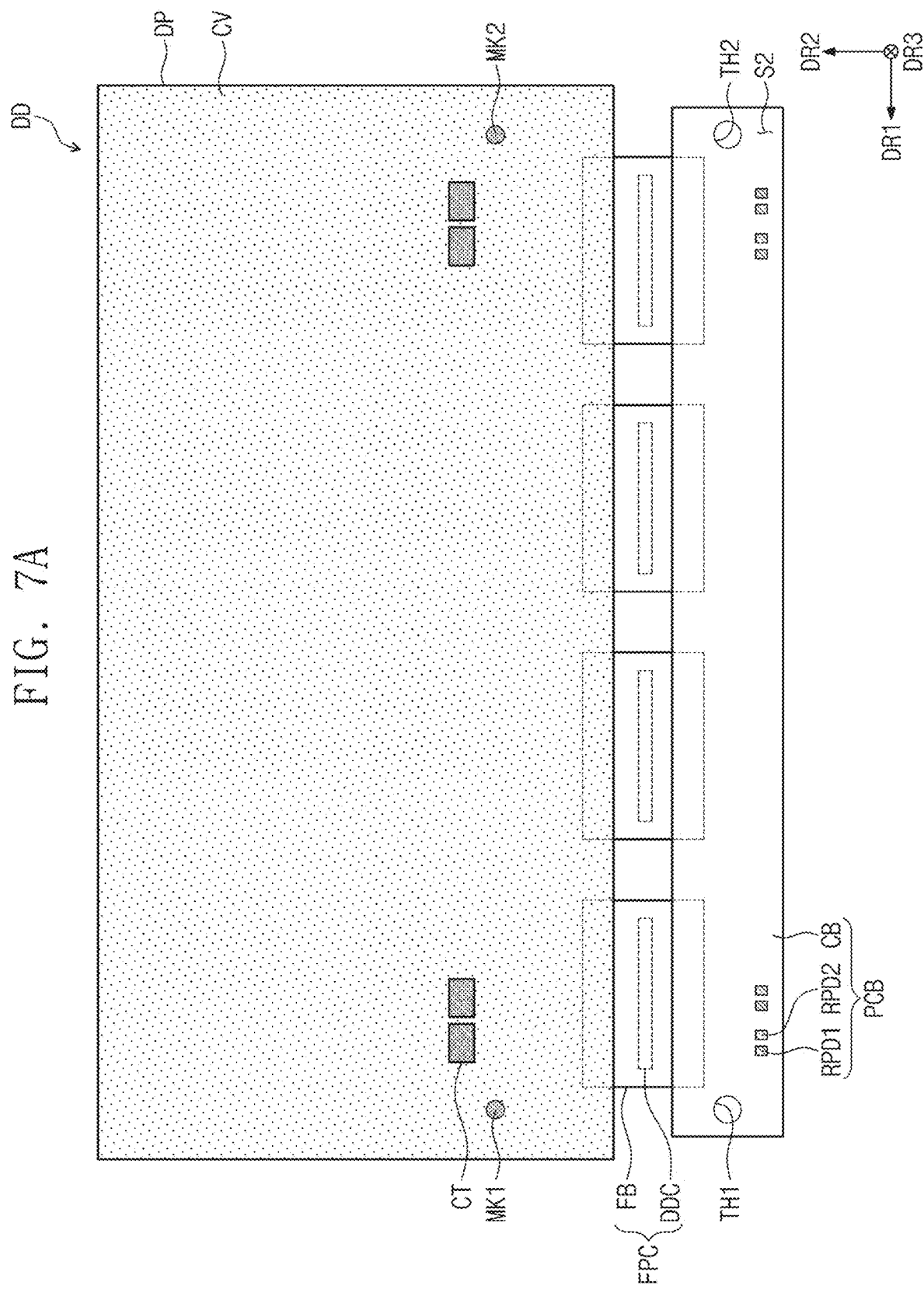
FIGS. 7A and 7B are schematic plan views of a display device according to an embodiment of the invention.
Figure 7B:
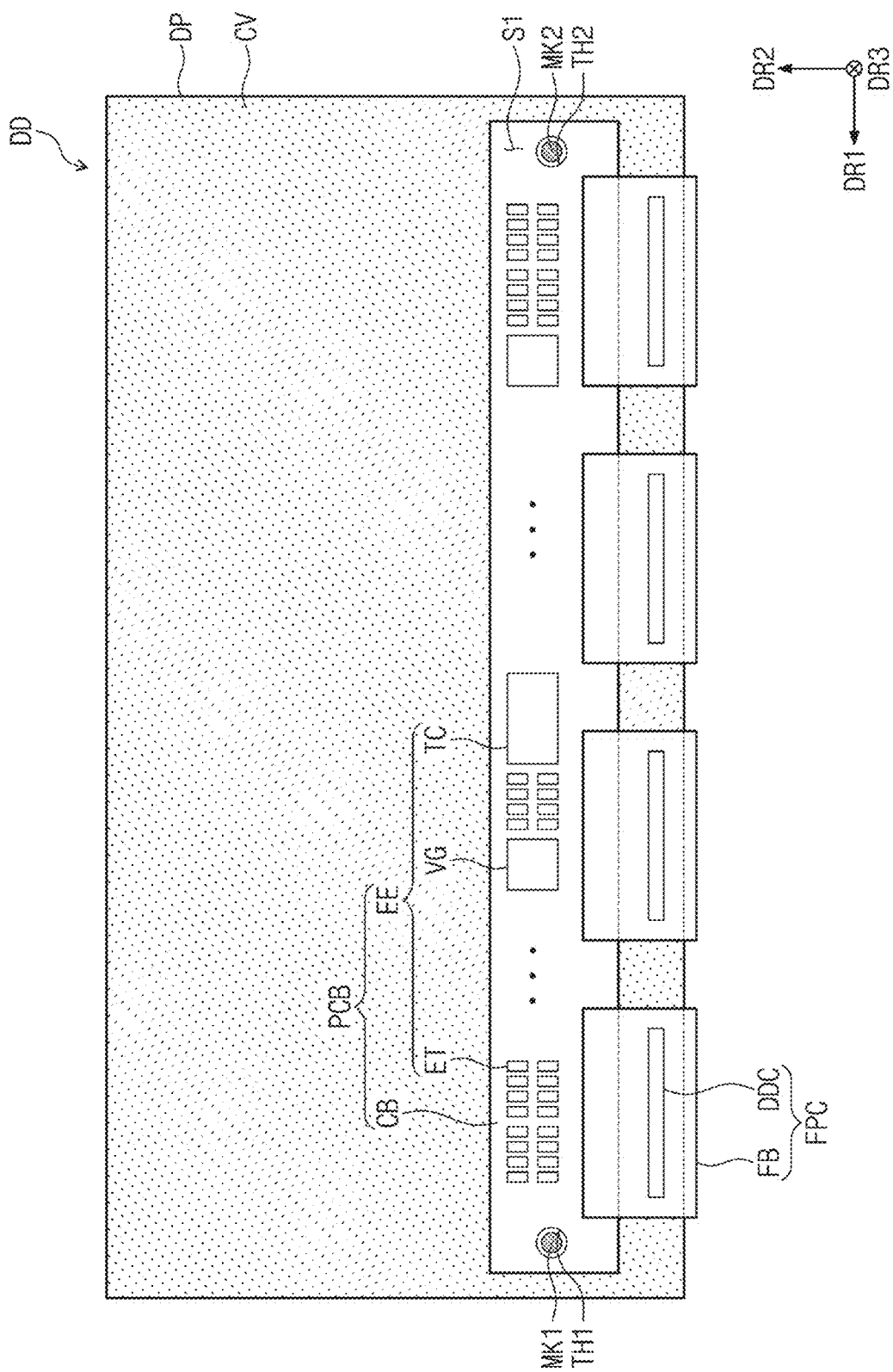

FIGS. 7A and 7B are schematic plan views of a display device according to an embodiment. FIGS. 7A and 7B are schematic plan view of a display device DD as seen on a rear surface of a display panel DP. FIG. 7A corresponds to a state before a flexible circuit board FPC is bent, and FIG. 7B corresponds to a state after the flexible circuit board FPC is bent. The same or like components of the display device DD according to an embodiment illustrated in each of FIGS. 7A and 7B as those described above are labeled with the same or like reference characters, and any repetitive detailed description thereof will be omitted or simplified for convenience description.

Referring to FIGS. 7A and 7B, an embodiment of the display device DD may further include a cover member CV disposed on the rear surface of the display panel DP. The cover member CV may be disposed on the rear surface of the display panel DP to protect the display panel DP from external impact or interference. In an embodiment, for example, the cover member CV may include at least one of a light shielding layer or a heat dissipation layer.

The light shielding layer may shield light emitted to the rear surface of the display panel DP. Accordingly, the light shielding layer may prevent components, which are disposed on the rear surface of the display panel DP, from being visible from an outside.

The heat dissipation layer may effectively dissipate heat generated from the display panel DP. The heat dissipation layer may include at least one selected from graphite, copper (Cu), and aluminum (Al), which has high heat dissipation properties. However, the material of the heat dissipation layer is not limited thereto. The heat dissipation layer may improve the heat dissipation properties of the display panel DP, and block or absorb electromagnetic waves generated from electronic elements to prevent the electromagnetic waves from affecting the display panel DP as noise.

Referring to FIGS. 7A and 7B, conductive patterns CT may be disposed on a rear surface of the cover member CV. In an embodiment, for example, the conductive patterns CT may be in contact with the rear surface of the cover member CV. The conductive patterns CT may be disposed apart from each other on a plane. Each of the conductive patterns CT may be provided to electrically connect resistive pads RPD1 and RPD2 of the circuit board PCB to be disposed on the rear surface of the cover member CV.

In an embodiment, a through-hole TH1 and TH2 may be defined through the circuit board PCB. According to an embodiment of the invention, the through-hole TH1 and TH2 may be provided in plural, and a plurality of through-holes TH1 and TH2 may be spaced apart from each other with the resistive pads RPD1 and RPD2 therebetween on a plane. Among the through-holes TH1 and TH2, a first through-hole TH1 may be disposed adjacent to one end of the board CB, and a second through-hole TH2 may be disposed adjacent to another end, opposite to the one end, of the board CB.

The through-holes TH1 and TH2 may not overlap the electronic elements EE, the resistive pads RPD1 and RPD2, and the signal lines of the circuit board PCB. Thus, the through-holes TH1 and TH2 may not affect driving of the circuit board PCB. The through-holes TH1 and TH2 may be holes into which a support for fixing the board CB is inserted during manufacture of the circuit board PCB. However, an embodiment is not limited thereto. Alternatively, the through-holes TH1 and TH2 may serve as an indicator with which the arrangement positions of the resistive pads RPD1 and RPD2 are predicted.

The display device DD may further include an alignment mark MK1 and MK2 disposed on the cover member CV. The alignment mark MK1 and MK2 may be provided in plural, and a plurality of alignment marks MK1 and MK2 may be disposed apart from each other. In an embodiment, for example, a first alignment mark MK1 and a second alignment mark MK2 may be disposed apart from each other with the conductive patterns CT therebetween on a plane.

The alignment marks MK1 and MK2 may be disposed in a same layer as the conductive patterns CT. However, an embodiment is not limited thereto as long as the alignment marks MK1 and MK2 may serve as an indicator which indicates the arrangement positions of the conductive patterns CT.

Each of the alignment marks MK1 and MK2 may have a specific color different from that of the cover member CV. Accordingly, the alignment marks MK1 and MK2 may be used as an indicator with which the arrangement positions of the conductive patterns CT are predicted.

Referring to FIG. 7B, the circuit board PCB may be disposed on the rear surface of the display panel DP. The second surface S2 (see FIG. 7A) of the board CB may face the rear surface of the display panel DP, and the first surface S1 of the board CB may face outwardly on the rear surface of the display panel DP. Thus, the resistive pads RPD1 and RPD2 (see FIG. 7A), which are disposed on the second surface S2 (see FIG. 7A), may face the rear surface of the display panel DP, and the electronic elements EE, which are disposed on the first surface S1, may face outwardly on the rear surface of the display panel DP.

Since the circuit board PCB is disposed on the rear surface of the display panel DP, each of the conductive patterns CT may overlap the resistive pads RPD1 and RPD2. The resistive pads RPD1 and RPD2 may be in contact with a corresponding conductive pattern CT, and the resistive pads RPD1 and RPD2, which are in contact with the same conductive pattern CT, may be electrically connected to each other.

In an embodiment, the conductive patterns CT and the resistive pads RPD1 and RPD2 are desired to be aligned in predetermined positions to be connected to each other. The positions of the resistive pads RPD1 and RPD2 may be predicted from the positions of the through-holes TH1 and TH2, and the positions of the conductive patterns CT may be predicted from the positions of the alignment marks MK1 and MK2. Here, whether the conductive patterns CT and the resistive pads RPD1 and RPD2 are arranged with each other as designed or predetermined may be verified by checking whether the through-holes TH1 and TH2 and the alignment marks MK1 and MK2 are aligned with each other as designed or predetermined or not.

When the alignment marks MK1 and MK2 respectively overlap the through-holes TH1 and TH2 in a predetermined way, this indicates that the circuit board PCB is aligned in a desired position on the rear surface of the display panel DP. However, when at least one of the alignment marks MK1 and MK2 does not overlap the through-hole TH1 and TH2 in the predetermined way, this indicates that the circuit board PCB has an error in alignment. Thus, in such an embodiment where the circuit board PCB is provided on the rear surface of the display panel DP, the reliability of the display device DD may be improved by checking whether the through-holes TH1 and TH2 and the alignment marks MK1 and MK2 are aligned with each other as designed or predetermined or not.

Figure 8:
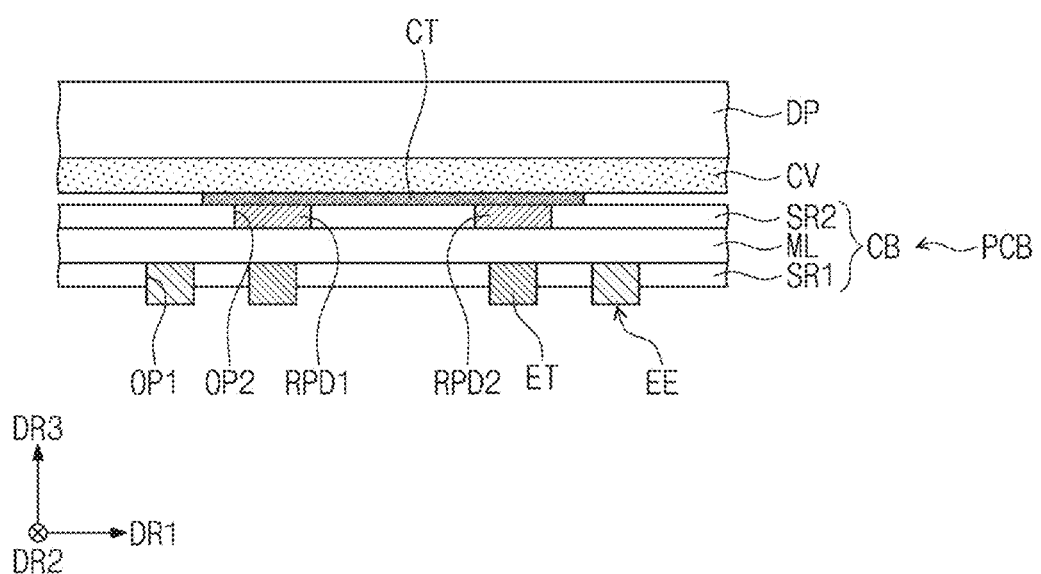
FIG. 8 is a cross-sectional view of a display device according to an embodiment of the invention.

FIG. 8 is a cross-sectional view of a display device according to an embodiment. FIG. 8 illustrates a schematic cross-section of a display device DD, which corresponds to resistive pads RPD1 and RPD2 electrically connected by a single conductive pattern CT. The same or like components of the display device according to an embodiment illustrated in FIG. 8 as those described above are labeled with the same or like reference characters, and any repetitive detailed description thereof will be omitted or simplified for convenience description.

Referring to FIG. 8, the conductive pattern CT may be disposed between a cover member CV and the resistive pads RPD1 and RPD2. The conductive pattern CT may cover at least two resistive pads RPD1 and RPD2 to electrically connect the at least two resistive pads RPD1 and RPD2 to each other. The resistive pads RPD1 and RPD2, which are electrically connected to each other by the conductive pattern CT, may serve as a zero-ohm resistor as described above.

The resistive pads RPD1 and RPD2 and the electronic elements EE may be formed on surfaces, opposite to each other, of the board CB so that the resistive pads RPD1 and RPD2 may overlap some of the electronic elements EE on a plane. FIG. 8 illustrates an embodiment where the resistive pads RPD1 and RPD2 overlap an element ET, but an embodiment is not limited thereto. Accordingly, the circuit board PCB according to an embodiment of the invention may have the board CB with a minimized area due to efficient use of the space of the board CB and also have the same effect as the case where the zero-ohm resistor is connected.

In embodiments of the invention, the resistive pad may be disposed a surface opposing the surface on which the electronic elements are mounted on the circuit board, thereby minimizing the space for disposing the resistive pads and reducing the area of the circuit board.

In embodiments of the invention, the resistive pad may be electrically connected to the electronic elements, thereby serving as a zero-ohm resistor used for circuit option setting or circuit analysis.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A circuit board comprising:
   a board including a first surface and a second surface opposing the first surface, wherein the board includes at least one conductive layer and at least one insulating layer;
   a plurality of electronic elements disposed on the first surface of the board;
   a plurality of resistive pads disposed on the second surface of the board and electrically connected to at least one selected from the electronic elements; and
   a conductive pattern disposed on the resistive pads,
   wherein the resistive pads are disposed between the electronic elements and the conductive pattern in a thickness direction of the board such that a portion of the resistive pads in direct contact with the conductive pattern overlaps the electric component in the thickness direction,
   wherein the at least one conductive layer and the at least one insulating layer extend parallel to each other along a plane perpendicular to the thickness direction of the board, and
   wherein the resistive pads have a resistance of zero ohm.

2. The circuit board of claim 1, wherein the conductive pattern electrically connects at least two resistive pads among the resistive pads to each other.

3. The circuit board of claim 2, wherein the conductive pattern comprises a conductive tape having an adhesive property.

4. The circuit board of claim 1, wherein
   the board comprises a first insulating layer, which defines the second surface,
   a plurality of opening portions is defined through the first insulating layer, and
   the resistive pads are respectively disposed in the opening portions.

5. The circuit board of claim 4, wherein the first insulating layer comprises a photo solder resist.

6. The circuit board of claim 1, wherein
   the at least one conductive layer and the at least one insulating layer of the board are each provided in plural,
   a plurality of conductive layers and a plurality of insulating layers are disposed alternately with each other,
   at least two conductive layers among the conductive layers are connected to each other through a hole defined in an insulating layer disposed therebetween.

7. The circuit board of claim 1, wherein the electronic elements comprise at least one selected from a timing controller, a voltage generator, a resistor, an inductor, and a capacitor.

8. The circuit board of claim 7, wherein the resistive pads are electrically connected to at least one selected from the voltage generator and the timing controller.

9. The circuit board of claim 1, wherein the at least one conductive layer extends entirely between opposite ends of the board along a direction perpendicular to the thickness direction of the board.

10. The circuit board of claim 1, wherein an entirety of one of the electronic elements overlaps the resistive pad in the thickness direction of the board.

11. The circuit board of claim 1, wherein an entirety of one of the resistive pads overlaps the conductive pattern in the thickness direction of the board.

12. The circuit board of claim 1, wherein an entirety of one of the electronic elements overlaps the conductive pattern in the thickness direction of the board.

13. The circuit board of claim 1, wherein an entirety of an upper surface of the resistive pads is a flat surface.

* * * * *